(12) United States Patent
Grivna et al.

(10) Patent No.: US 9,812,354 B2
(45) Date of Patent: Nov. 7, 2017

(54) PROCESS OF FORMING AN ELECTRONIC DEVICE INCLUDING A MATERIAL DEFINING A VOID

(71) Applicant: Semiconductor Components Industries, LLC, Phoenix, AZ (US)

(72) Inventors: Gordon M. Grivna, Mesa, AZ (US); Michael Thomason, Blackfoot, ID (US); Stevan Gaurdello Hunter, Pocatello, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 76 days.

(21) Appl. No.: 14/713,603

(22) Filed: May 15, 2015

(65) Prior Publication Data

US 2016/0336184 A1 Nov. 17, 2016

(51) Int. Cl.
*H01L 21/308* (2006.01)
*H01L 21/768* (2006.01)
(Continued)

(52) U.S. Cl.
CPC .... *H01L 21/76831* (2013.01); *H01L 21/3083* (2013.01); *H01L 21/76898* (2013.01);
(Continued)

(58) Field of Classification Search
CPC ................................................ H01L 21/3083
See application file for complete search history.

(56) References Cited

U.S. PATENT DOCUMENTS

| 4,745,081 A | 5/1988 | Beyer et al. |
| 5,501,893 A | 3/1996 | Laermer et al. |

(Continued)

FOREIGN PATENT DOCUMENTS

| DE | 102005039068 A1 | 2/2007 |
| JP | 2002043502 A | 2/2002 |

(Continued)

OTHER PUBLICATIONS

Bauer, Thomas, "High Density Through Wafer via Technology"; Technical Proceedings of the 2007 Nanotechnology Conference & Trade Show, vol. 3; May 20-24, 2007; pp. 116-119; Santa Clara, CA.

(Continued)

*Primary Examiner* — David Zarneke
(74) *Attorney, Agent, or Firm* — Abel Law Group, LLP

(57) ABSTRACT

An electronic device can include one or more trenches that include a material that defines one or more voids. In an embodiment, the substrate defines a first trench having a first portion and a second portion laterally adjacent to the first portion, wherein the first portion has with a first width, the second portion has a second width, and the first width is wider than the second width. The material defines a first void at a predetermined location within the first portion of the first trench and has a seam within the second portion of the first trench. In another embodiment, the substrate defining a trench, and the material that defines spaced-apart voids at predetermined locations within the trench. A process of forming the electronic device can include patterning a substrate to define a trench, and depositing a material within the trench, wherein the deposited material defines a void.

20 Claims, 6 Drawing Sheets

(51) Int. Cl.
*H01L 23/48* (2006.01)
*H01L 27/08* (2006.01)
*H01L 29/94* (2006.01)

(52) U.S. Cl.
CPC ...... *H01L 23/481* (2013.01); *H01L 21/76877* (2013.01); *H01L 27/0805* (2013.01); *H01L 29/945* (2013.01)

(56) References Cited

U.S. PATENT DOCUMENTS

| | | | |
|---|---|---|---|
| 6,621,136 B2 | 9/2003 | Grivna | |
| 6,818,525 B1 | 11/2004 | Durham et al. | |
| 6,841,883 B1 | 1/2005 | Farnworth et al. | |
| 6,984,860 B2 | 1/2006 | Grivna et al. | |
| 7,087,925 B2 | 8/2006 | Grivna | |
| 7,315,223 B2 | 1/2008 | Margomenos | |
| 7,326,629 B2 | 2/2008 | Nagarajan et al. | |
| 7,344,959 B1 | 3/2008 | Pogge et al. | |
| 7,388,277 B2 | 6/2008 | Pogge et al. | |
| 7,411,266 B2 | 8/2008 | Tu et al. | |
| 7,452,796 B2 | 11/2008 | Davies | |
| 7,485,965 B2 | 2/2009 | Lanzerotti et al. | |
| 7,485,968 B2 | 2/2009 | Enquist et al. | |
| 7,510,907 B2 | 3/2009 | Heck et al. | |
| 7,560,802 B2 | 7/2009 | Kalvesten et al. | |
| 7,589,009 B1 | 9/2009 | Kar-Roy et al. | |
| 7,589,390 B2 | 9/2009 | Yao | |
| 7,608,534 B2 | 10/2009 | Yun et al. | |
| 7,611,931 B2 | 11/2009 | Cheng et al. | |
| 7,615,462 B2 | 11/2009 | Kim et al. | |
| 7,626,269 B2 | 12/2009 | Oliver et al. | |
| 7,645,701 B2 | 1/2010 | Anderson et al. | |
| 7,670,927 B2 | 3/2010 | Bernstein et al. | |
| 7,675,162 B2 | 3/2010 | Foster et al. | |
| 7,679,146 B2 | 3/2010 | Tu et al. | |
| 7,687,916 B2 | 3/2010 | Lake | |
| 7,727,887 B2 | 6/2010 | Christensen et al. | |
| 7,741,722 B2 | 6/2010 | Andry et al. | |
| 7,803,714 B2 | 9/2010 | Ramiah et al. | |
| 7,998,852 B2 | 8/2011 | Jones et al. | |
| 8,292,690 B2 | 10/2012 | Seddon | |
| 8,357,944 B2 | 1/2013 | Drabe et al. | |
| 8,492,260 B2 | 7/2013 | Parsey, Jr. et al. | |
| 8,981,533 B2 * | 3/2015 | Grivna ................ | H01L 23/481 257/621 |
| 2003/0113981 A1 | 6/2003 | Combi et al. | |
| 2004/0212099 A1 | 10/2004 | Klein et al. | |
| 2006/0097357 A1 | 5/2006 | Nemoto | |
| 2007/0134819 A1 | 6/2007 | Uchiyama | |
| 2008/0105976 A1 | 5/2008 | Pogge et al. | |
| 2008/0272499 A1 | 11/2008 | DeNatale et al. | |
| 2008/0291601 A1 | 11/2008 | Roozeboom et al. | |
| 2009/0001600 A1 | 1/2009 | Somani | |
| 2009/0170272 A1 | 7/2009 | Nakamura | |
| 2009/0294983 A1 | 12/2009 | Cobbley et al. | |
| 2009/0311828 A1 | 12/2009 | Andry et al. | |
| 2009/0315188 A1 | 12/2009 | Anderson et al. | |
| 2010/0295066 A1 | 11/2010 | Drabe et al. | |
| 2012/0049320 A1 * | 3/2012 | Parsey, Jr. ......... | H01L 21/76898 257/528 |
| 2013/0277807 A1 | 10/2013 | Parsey, Jr. et al. | |
| 2014/0070375 A1 | 3/2014 | Grivna | |

FOREIGN PATENT DOCUMENTS

| | | |
|---|---|---|
| WO | 2004084300 A1 | 9/2004 |
| WO | 2007054870 A1 | 5/2007 |

OTHER PUBLICATIONS

Chow, Eugene M. et al.; "Process Compatible Polysilicon-Based Electrical Through-Wafer Interconnects in Silicon Substrates"; Journal of Microelectromechanical Systems; vol. 11, Issue 6.; Dec. 2002; pp. 631-640; IEEE ISSN 1057-7157.

Igic, Petar et al.; "Technology for Power Integrated Circuits with Multiple Vertical Power Devices"; 18th International Symposium on Power Semiconductor Devices & IC's; Jun. 4-8, 2006; Naples, Italy; 4 pages.

Klootwijk, J.H. et al.; "Ultrahigh Capacitance Density for Multiple ALD-Grown MIM Capacitor Stacks in 3-D Silicon"; IEEE Electron Device Letters; Jul. 2008; vol. 29, Issue 7; pp. 740-742; IEEE ISSN 0741-3106.

Savastiouk, Sergey; "Through Silicon Vias (TSV): Design and Reliability"; IEEE Santa Clara Valley Chapter, Components, Packaging, Manufacturing Technology; May 13, 2009; 15 pages.

Vardaman, E. Jan, "3D Packaging and the Future of TSV", Presentation at SEMICON West 2008, 11 pages, TechSearch International, Inc. San Francisco, CA.

* cited by examiner

PROCESS OF FORMING AN ELECTRONIC DEVICE INCLUDING A MATERIAL DEFINING A VOID

FIELD OF THE DISCLOSURE

The present disclosure relates to electronic devices and processes of forming electronic devices, and in particular, electronic devices that include materials that define voids and processes of forming the same.

RELATED ART

Recent developments in etching tools and etch chemistries are allowing deep trenches to be formed with relatively high depth-to-width ratios. Such developments allow for through-silicon vias, capacitors, coaxial connectors and the like to be formed. For example, U.S. Pat. No. 8,492,260 and U.S. Pat. No. 8,981,533 illustrate some exemplary structures. FIG. 1, which corresponds to FIG. 16 in U.S. Pat. No. 8,981,533, illustrates a coaxial connector. In particular, FIG. 1 includes an illustration of a coaxial conductive member 142 that surrounds an inner conductor 140. Contained within the inner conductor 140 are generally S-shaped features 154, insulating layers 162, and a conductive material 144. Further improvements with deep trenches and materials formed within the deep trenches are desired.

BRIEF DESCRIPTION OF THE DRAWINGS

Embodiments are illustrated by way of example and are not limited in the accompanying figures.

Figure 1:
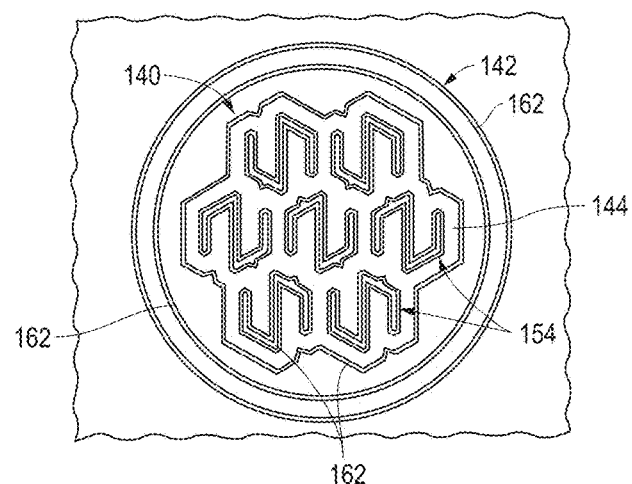
FIG. 1 includes an illustration of a top view of a coaxial conductor. (Prior art)

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "aspect ratio" is intended to mean the depth of a trench or opening divided by a width of such trench or opening. Unless explicitly stated otherwise, the aspect ratio of a trench or opening is the depth divided by the narrowest width of the trench or opening, wherein such narrowest width is measured near the top of the trench or opening. If the corners at the top of the trench or opening are rounded, such rounded corners are not used to determine the aspect ratio.

The term "lateral dimension" is intended to mean a dimension that is along a plane that is parallel to a primary surface of a substrate. Thus, lateral dimensions can be determined from a top view of a feature, such as a trench, a void within the trench, or the like. When the feature is circular, the lateral dimension is a diameter. For a polygonal shape, the lateral dimensions are length and width, wherein the length is greater than the width. The length may lie along a straight line, along a curve, along a serpentine path, or the like.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Figure 2:
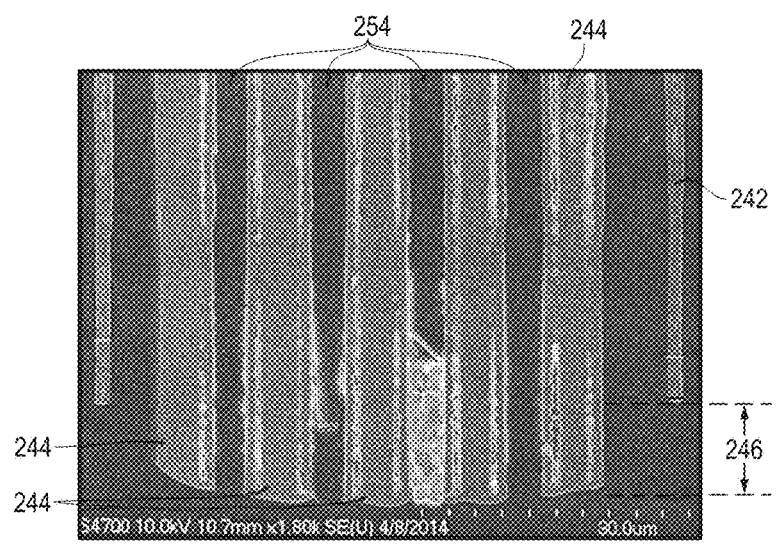
FIG. 2 includes a scanning electron microscope micrograph of a cross-sectional view of a similar structure to the one as illustrated in FIG. 1.

The inventors have discovered that, in some applications, forming trenches and filling the trenches may be quite challenging. FIG. 2 includes a scanning electron microscope (SEM) micrograph of a cross-sectional view of a structure similar to the one as illustrated in FIG. 1. A conductor 242 may be an isolation region that laterally surrounds an inner conductor or part of an n-axial connector. FIG. 2 further includes portions of generally S-shaped features 254 and a conductive material 244. As can be seen in FIG. 2, the depth of the trench in which the conductor 242 resides is significantly shallower than the trench in which the conductive material 244 resides. Dimension 246 can be 11 microns or even larger or be at least 25% of the depth of the shallower trench. Thus, the conductor 242 may not provide sufficient isolation or may not become exposed when the bottom portions of the conductive material 244 are subsequently exposed during a backside removal.

Figure 3:
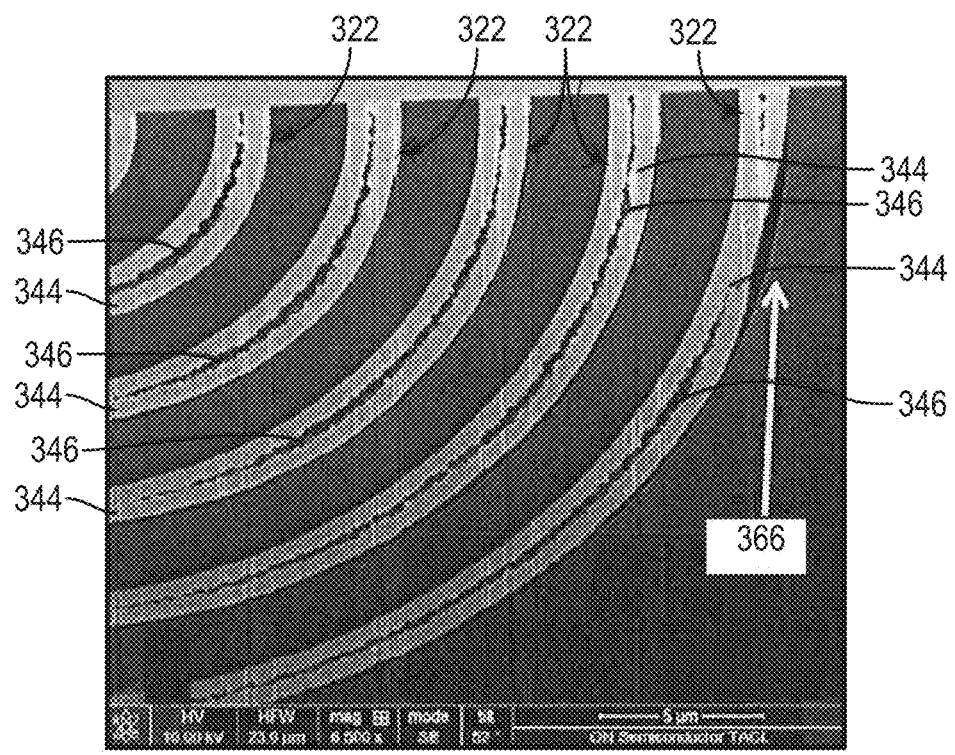
FIG. 3 includes a scanning electron microscope micrograph of a top view of concentric conductors having long voids and delamination.

FIG. 3 includes a SEM micrograph of concentric ring-shaped trenches 322 that each include a conductor 344. The conductors 344 do not completely fill the trenches 322 and define voids 346. Each of the voids 346 has a length that is substantially larger than the widths of the trenches. Such long voids 346 may compromise mechanical integrity and can allow the material of the conductor 344 to move during subsequent processing. Referring to the right-hand side of FIG. 3, one of the conductors 344 has delaminated from the sidewall of the trench 322. Although difficult to see, the trenches 322 can be lined with an insulating layer, and the insulating layer may become stressed or fracture during or as a result of the delamination or other subsequent processing after delamination. When delamination occurs, leakage current between the conductors 344 or between a conductor 344 and other components (not seen in FIG. 3) may become too great.

The inventors have discovered that trenches can be formed having shapes with wider portions at predetermined locations helps to keep trench depths more uniform between different trenches within the same substrate, more reproducible, more uniform from substrate to substrate, or both. Furthermore, the inventors have discovered that materials formed within the trenches can define voids at predetermined locations to help reduce the likelihood that the material within a trench will delaminate. Thus, rather than completely eliminating voids altogether, the use of a wider portion of a trench can allow a void to be formed at a predetermined location. The wider portion of the trench allows etchant and etch product gases during the formation of the trench to flow more easily and uniformly along the depth of the trench. The final depth of the trench can be adjusted up or down by the density and location of the wider portions of the trench that correspond where intentional voids will be formed. A higher density of wider portions of the trench will increase the flow of etchant and product gases therefore leading to a deeper trench. The void formed within the material can serve a similar function during deposition or fill of the trench. The wider portion of the trench allows a void to be formed at a predetermined location to allow deposition precursor and deposition product gases to flow more easily along the depth of the unfilled portion of the trench. The material formed within the trench can be conductive, insulating, or a semiconductor. The concepts are better understood with respect to exemplary embodiments described and illustrated herein that do not limit the scope of the present invention.

Figure 4:
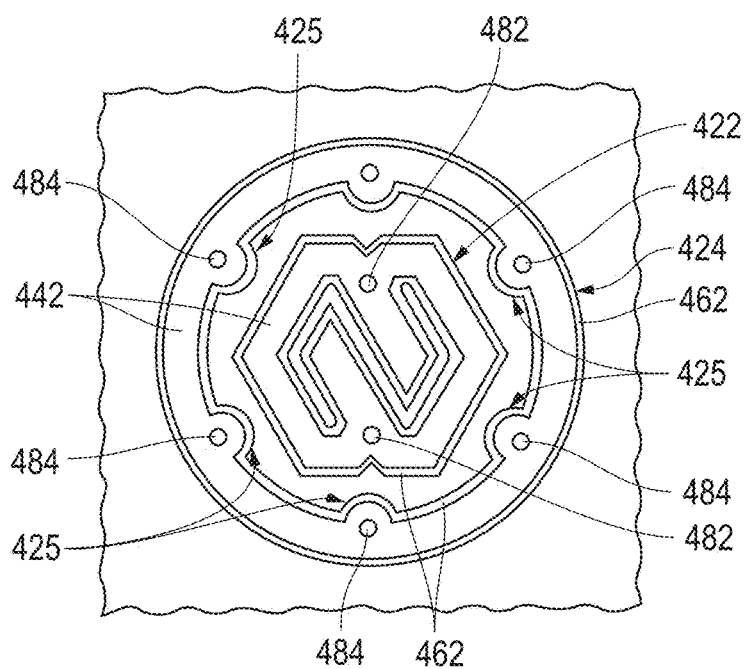
FIG. 4 includes an illustration of a portion of a workpiece that includes trenches having wider portions and a material within the trenches that defines voids within the wider portions of the trenches in accordance with an embodiment.
Figure 5:
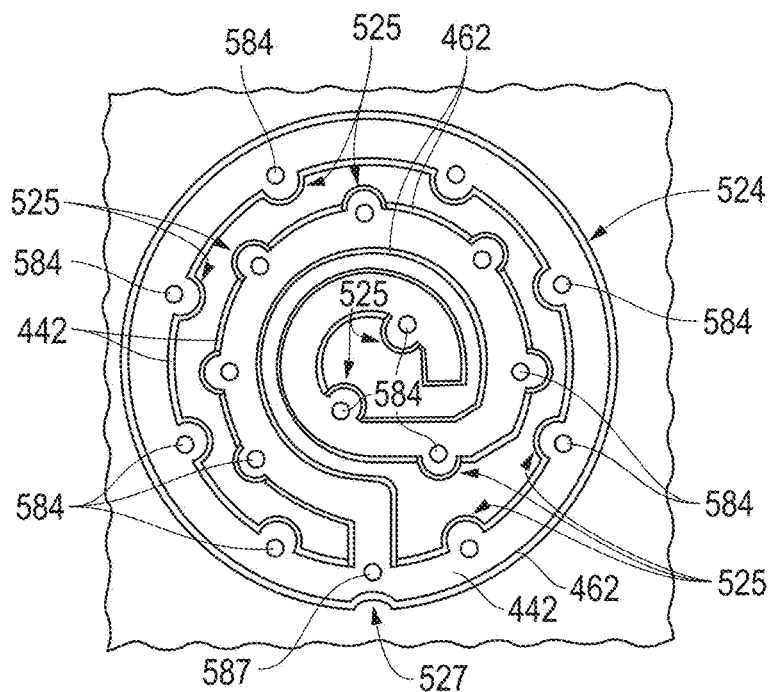
FIG. 5 includes an illustration of a portion of a workpiece that includes a trench having wider portions and a material within the trenches that defines voids within the wider portions of the trench in accordance with another embodiment.
Figure 6:
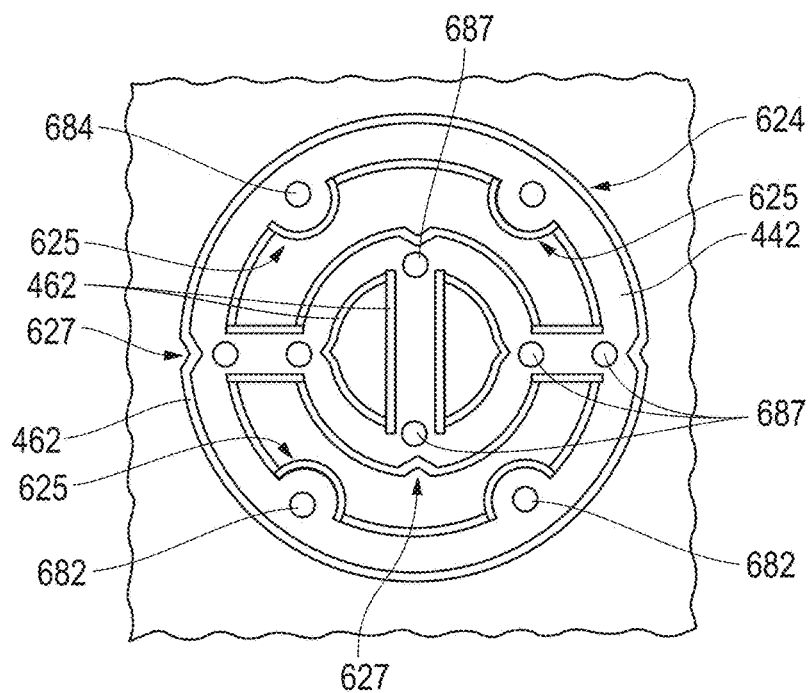
FIG. 6 includes an illustration of a portion of a workpiece that includes a trench having wider portions and a material within the trenches that defines voids within the wider portions of the trench in accordance with another embodiment.

FIGS. 4 to 6 illustrate different embodiments in which trenches have wider portions that allow voids to be formed at predetermined locations. FIG. 4 includes an illustration of a top view of a portion of a workpiece that includes a substrate that defines trenches 422 and 424. An S-shaped feature 454 is a portion of the substrate that is laterally surrounded by the trench 422. As illustrated in FIG. 4, an insulating layer 462 is at the sidewalls of the trenches 422 and 424, and a material 442 fills most of the remainder of the trenches 422 and 424.

The layout of the trench 422 and feature 454 is sized so that voids 482 are formed at predetermined locations within the trench 422. The trench 424 includes portions having substantially uniform width and wider portions 425, and voids 484 are formed at predetermined locations within the wider portions 425. The voids 482 are spaced apart from one another, and the voids 484 are spaced apart from one another. The layout and wider portions help to allow etchant and etch product gases to reach more easily the bottoms of the trenches 422 and 424. When depositing the material 442, the voids 482 and 484 allow deposition gases to fill the trenches 422 and 424 more uniformly. As the material 442 fills the trenches, seams (not illustrated in top views) can form when the material 442 advances from opposite sidewalls and meet near the center of the trenches 422 and 424. As the material 442 fills the trenches 422 and 442, other voids (not illustrated) may form at locations that are not predetermined. If such voids form, the voids will form along the seams and have lateral dimensions that are substantially smaller than the voids 482 and 484. For example, the lateral dimensions of such other voids are no greater than 0.3, no greater than 0.2, or no greater than 0.09 times a lateral dimension of the voids 482 or 484. In a particular example when any of the voids 482 and 484 have a polygonal shape, the greater of lateral dimension of any or all of such other voids may be no greater than 0.3, no greater than 0.2, or no greater than 0.09 times a smaller lateral dimension of any or all of the voids 482 or 484.

FIG. 5 includes an alternative embodiment. A trench 524 includes wider portions 525 and an indentation 527. The wider portions 525 and void 584 are similar to the previously described wider portions 425 and voids 484 as described with respect to FIG. 4. The indentation 527 can be used to control the void 587, so that it is closer in size to the voids 584, as compared to a void formed without the indentation 527 present. If the indentation 527 is not present, the void 587 may be much larger and cause the trench to be locally deeper at the corresponding location of the trench 524. FIG. 6 includes an alternative embodiment. A trench 624 includes wider portions 625 and indentations 627. The wider portions 625 and voids 684 are similar to the previously described wider portions 425 and voids 484 as described with respect to FIG. 4. The indentations 627 and voids 687 are similar to the previously described indentation 527 and voids 584 as described with respect to FIG. 5. Many other layouts are possible without deviating from the scope of the present invention. After reading this specification in its entirety, skilled artisans will appreciate that layouts can be designed for particular applications.

Figure 7:
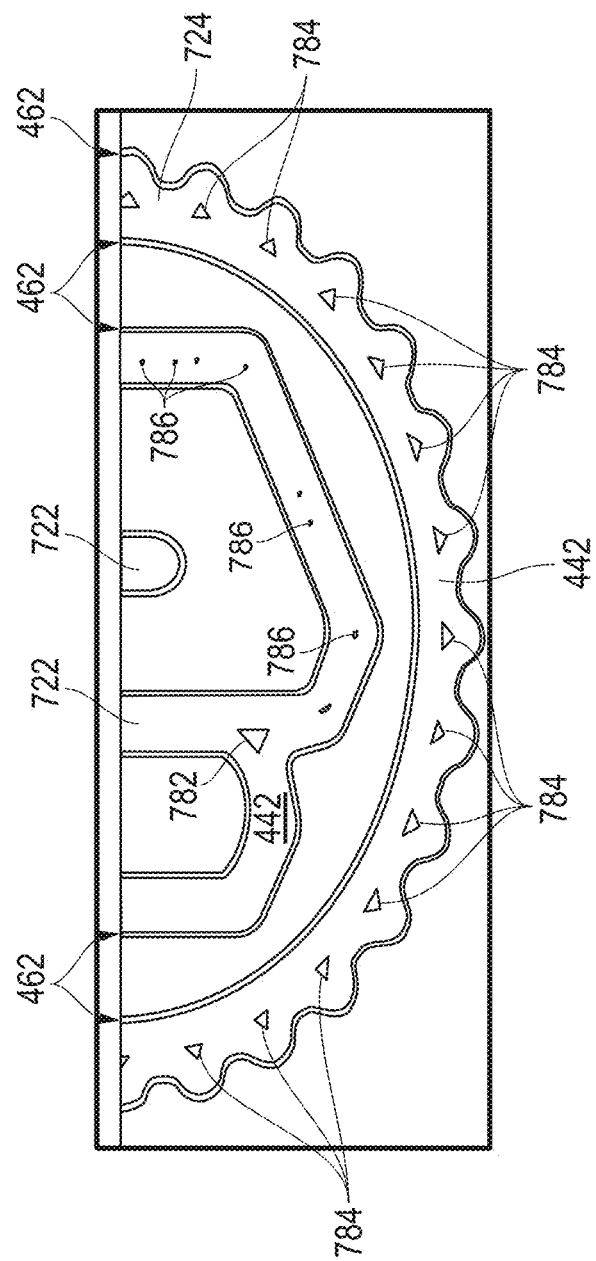
FIG. 7 includes a scanning electron microscope micrograph of a top view of trenches and material within the trenches, where the material defines voids within wider portions of the trenches.

FIG. 7 includes a SEM micrograph of a top view of trenches that include conductors 722 and 724. The trenches are lined with an insulating layer 462 and filled with a conductive material 442 that form the conductors 722 and 724. The conductive material 742 deposits in a direction from closer to the sidewalls of the trenches to the center of the trenches. Seams are formed along the centers of the trenches where the conductive material 742 fills the trenches. The seams are difficult to see in FIG. 7 due to sample preparation for SEM inspection.

Void 782 and 784 are formed within the wider portions of the trenches. The wider portions of the trenches and subsequently formed voids act as passage ways during etching and deposition to allow gases to flow into and out of deep elevations within the trenches. All of the voids 782 and 784 can be formed at predetermined locations as they are located within the wider portions of the trenches. The voids 782 and 784 allow for better mechanical integrity of the conductors 722 and 724 as very long voids, such as those illustrated in FIG. 3, may not be formed. Thus, delamination or other defects associated with the trenches or materials that fill the trenches that can compromise the performance of the electronic device are substantially reduced and may be eliminated.

Other voids 786 are also formed and are substantially smaller than voids 782 and 784. The other voids 786 lie along seams. In an embodiment, the voids 786 have lateral dimensions, wherein each of the lateral dimensions of the voids 786 may be no greater than 0.3 times, 0.2 times, or 0.09 times each of the one or more lateral dimensions of the voids 782 and 784. In another embodiment, the voids 786 have lateral dimensions, wherein each of the lateral dimensions of the voids 786 is at least $1 \times 10^{-3}$ times each of the one or more lateral dimensions of the voids 782 and 784. While the voids 786 will form near the center of the width direction of the trenches, the locations of such other voids 786 may not be predicted with a high level of certainty. Thus, the voids 786 may or may not be formed at predetermined locations. Referring to FIG. 7, the voids 786 are more likely to form at bends in the trench; however, not all bends have a void 786. Fewer voids 786 are formed along straight segments of the trench. Intentional voids 784 can be added to trench 442 in the area of voids 786 to further reduce the size and frequency of voids 786.

Depending on the etch tool used, the ability to control the shape of the trenches very deep into the substrate (for example, greater than 30 microns) at a relatively high aspect ratio (for example, depth/width of at least 5) may be difficult. At such lower depths, long voids, such as those seen in FIG. 3 may form. While such long voids are to be avoided, if such voids form, they may form deeper than 10 microns from the top of the trenches, and not be as problematic as a long void formed at or within 3 microns from the top of a trench.

FIGS. 8 to 11 include illustrations of cross sectional views of a portion of a workpiece during a process sequence in forming and filling trenches. The drawings are not to scale in order to improve understanding of the concepts described herein. For example, the trenches may be several tens of microns deep, and each of the layers formed over trenches may have a thickness less than one micron, and even less than 0.1 micron. Although the process below is described with respect to conductive fill materials, trenches can be filled with other materials, such as an insulative material or a semiconductor material. The workpiece may contain electronic components outside the trenches or electronic components that are at least partly or completely formed within the trenches. U.S. Pat. No. 8,492,260 and U.S. Pat. No. 8,981,533, both of which are incorporated by reference in their entireties, illustrate and describe some of such components.

Figure 8:
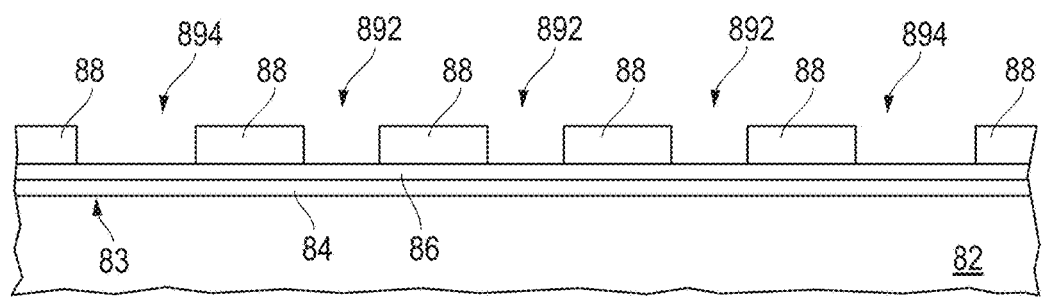
FIG. 8 includes an illustration of a cross-sectional view of a portion of a workpiece including a substrate, a pad layer, a stopping layer, and a patterned masking layer.

FIG. 8 includes an illustration of a cross-sectional view of a portion of a workpiece 80 that includes a substrate 82. The substrate 82 can include a monocrystalline semiconductor wafer, a semiconductor-on-insulator wafer, a flat panel display (e.g., a silicon layer over a glass plate), or another substrate conventionally used to form electronic devices. The portion of the substrate 82 as illustrated in FIG. 8 includes a Group 14 element (e.g., carbon, silicon, germanium, or any combination thereof) that includes an n-type or p-type dopant. In another embodiment, the substrate 82 includes a III-V or II-VI semiconductor material. The substrate 82 includes a primary surface 83. When the substrate 82 is in the form of a wafer, the initial thickness substantially corresponds to the thickness of the wafer before any processing is performed. In an embodiment, the thickness may be no greater than 2000 microns, and in another embodiment, the thickness may be no greater than 900 microns. In a further embodiment, the thickness is at least 110 microns, and in another further embodiment, the thickness is at least 150 microns. In a particular embodiment, the thickness is in a range of 600 to 800 microns. In another particular embodiment, the substrate 82 has a thickness in a range of 150 microns to 120 microns. In an embodiment, the substrate 82 may have a nominal size (for example, a nominal diameter) of at least 150 cm. Although the substrate 82 does not have a theoretical upper limit, the nominal size of the substrate 82 may not exceed 400 cm.

A pad layer 84, a stopping layer 86 (e.g., a polish-stop layer or an etch-stop layer), and a mask layer 88 are sequentially formed over the substrate 82 using a thermal growth technique, a deposition technique, or a combination thereof. Each of the pad layer 84 and the stopping layer 86 can include an oxide, a nitride, an oxynitride, another suitable material, or any combination thereof. In an embodiment, the stopping layer 86 has a different composition as compared to the pad layer 84. In a particular embodiment, the pad layer 84 includes an oxide, and the stopping layer 86 includes a nitride.

The mask layer 88 is formed over the stopping layer 86 and is patterned to define openings 892 and 894 under which trenches in the substrate 82 will be formed. In an embodiment, the mask layer 88 includes an organic resist material, and in another embodiment, the mask layer 88 may include an inorganic material different from the substrate 82. The opening 892 is at a location corresponding to where, from a top view, an inner conductor will be formed, and the opening 894 is at a location corresponding to where, from a top view, an outer conductor will be formed. The portions of the opening 892 that are illustrated in FIG. 8 do not include wider portions. Thus, seams or very small voids will form in the portions of the opening 892. Although not illustrated, other portions of the opening 892 can include wider portions where voids will be subsequently formed. In the embodiment as illustrated in FIG. 8, the opening 894 includes wider portions where voids will be subsequently formed. Although not illustrated, other portions of the opening 894 can include narrower portions where seams or very small voids will be subsequently formed.

Figure 9:
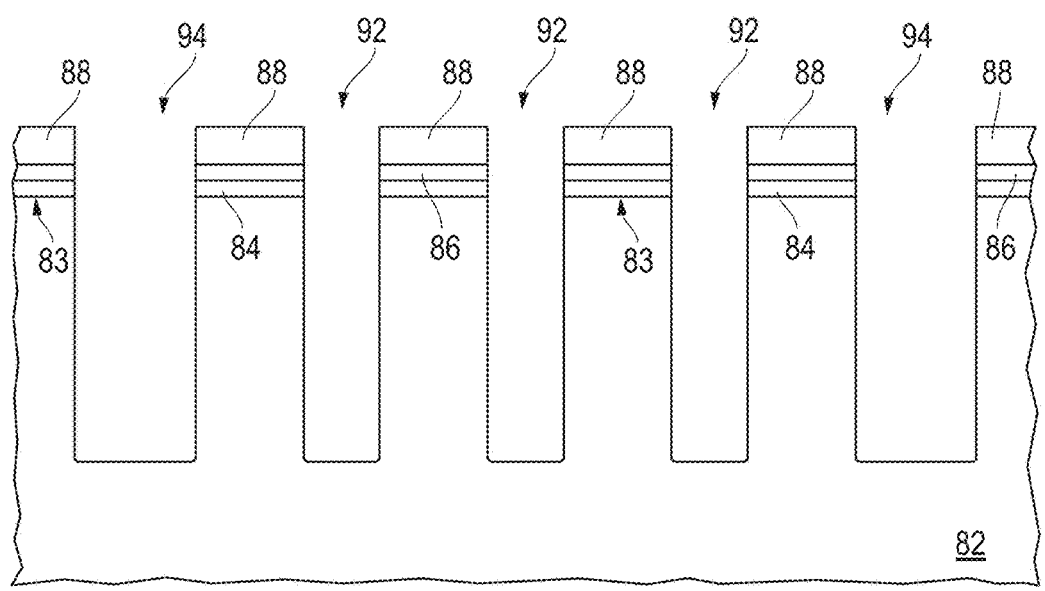
FIG. 9 includes an illustration of a cross-sectional view of the workpiece of FIG. 8 after etching through the pad layer and the stopping layer and defining trenches within the substrate.

An etch operation is performed to pattern the pad layer 84, stopping layer 86, and substrate 82 to define trenches 92 and 94 that extend from the primary surface 83, as illustrated in FIG. 9. Portions of the substrate 82 are disposed between portions of each of the trenches 92 and 94. The trenches 92 and 94 have a depth as measured from the major surface 83.

The depth can be at least 11 microns, at least 20 microns, or least 40 microns. In an embodiment, such as for through-substrate vias or n-axial connectors, the depth can be at least 75 microns, and in another embodiment, can be at least 110 microns, at least 200 microns, or more. In an embodiment, the aspect ratios of the trenches 92 and 94 are at least 5, at least 9, or at least 11, and in another embodiment, the aspect ratios are no greater than 99, no greater than 50, or no greater than 20. In an embodiment, the depths of the trenches 92 and 94 may be within no greater than 20%, no greater than 15%, or no greater than 9% of each other.

The widths of the portions of the trenches 92 and 94 may depend in part on the depths and aspect ratios of the trenches 92 and 94. Each of the narrower portions of the trenches 92 and 94 as illustrated in FIG. 2 can be in a range of 0.5 microns to 5.0 microns, and in a particular embodiment can be in a range of 2.0 micron to 4.0 microns. The wider portions of the trenches 92 and 94 where voids are to be formed have widths that can be in a range of 10% to 500% wider than the narrower portions, and in a particular embodiment, can be in a range of 20% to 100% wider than the narrower portions. The portions of the substrate 82 between the portions of the same trench or between different trenches can be in a range of 0.2 micron to 2 microns, and in a particular embodiment, can be in a range of 0.5 microns to 1.4 microns. In another embodiment, the portions of the substrate 82 can be quite large in the case of coaxial rings or other electronic components. After forming the trenches, the mask layer 88 is removed.

Figure 10:
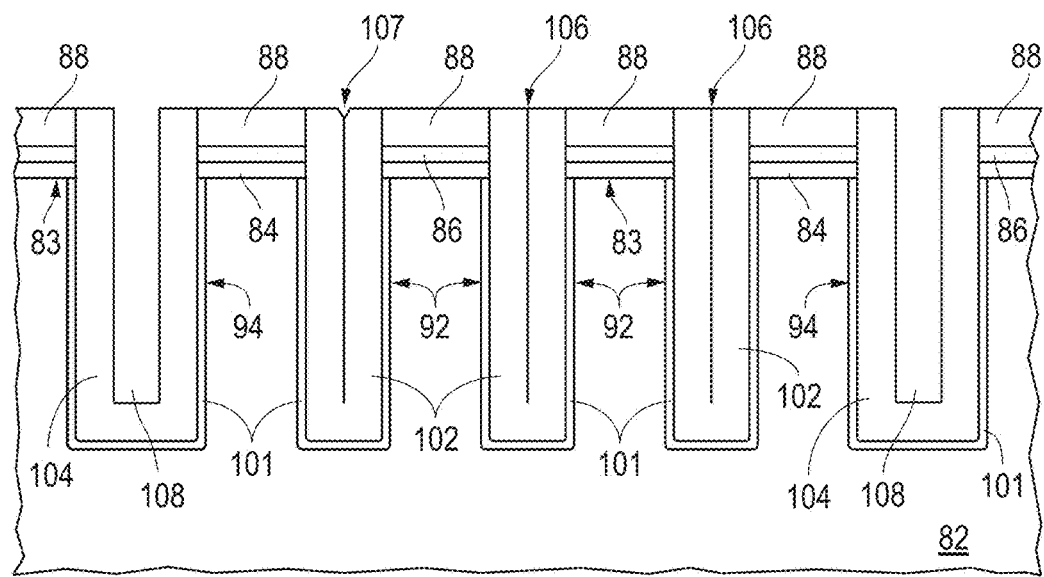
FIG. 10 includes an illustration of a cross-sectional view of the workpiece of FIG. 9 after forming an insulating layer within the trenches, filling the trenches with a material, and removing a portion of the material from over the stopping layer.

FIG. 10 includes an illustration of a cross-sectional view of the workpiece after forming an insulating layer 101, filling the trenches with a fill material, and removing portions of the fill material outside the trenches to form conductors 102 and 104. The insulating layer 101 can be formed to insulate the sidewalls and bottoms of the trenches before forming the fill material. In an embodiment, the insulating layer 101 has a thickness no greater than 900 nm, and in another embodiment, has a thickness no greater than 700 nm. In a further embodiment, the insulating layer 101 has a thickness of at least 11 nm, and in still a further embodiment, the insulating layer 101 has a thickness of at least 100 nm. In a further embodiment, the insulating layer may not be present. The insulating layer 101 can include a single film or a plurality of films, wherein each film can include an oxide, a nitride, an oxynitride, an insulating polymer, or other dielectric film and can be formed thermally or by a deposition. In a particular embodiment, a thermal oxidation is performed to form at least part of the insulating layer 101. When the stopping layer 86 includes a nitride, the stopping layer 86 can act as an oxidation barrier to reduce the oxidation of the substrate 82 along the major surface 83.

The fill material for the conductors 102 and 104 can include a single material or a plurality of materials that can be in the form of layer, a plurality of layers, a single film, or a plurality of films. The fill material can be conductive, resistive, an insulator, or a combination therefore (for example, when forming capacitors within the trenches). The actual material, both composition(s) and number of material(s) will depend on the electronic component being formed. The fill material can be a conductive material and include amorphous silicon, polycrystalline silicon, a metal, an alloy, a metal nitride, a metal-semiconductor compound, a metal-semiconductor-nitrogen compound, or the like. The composition of the conductive material may depend on when the conductive material is formed. The conductors 102 and 104 may be formed before or after forming electronic components at least partly within the substrate 82. Such electronic components can include an active component (for example, a transistor), a passive component (for example, a resistor, a capacitor, a diode, or the like), or any combination thereof are at least partly formed within the substrate 82. If the conductive material is formed before forming such electronic component within the substrate 82, the conductive material may have to withstand relatively high temperatures, such as greater than 800° C. An exemplary material can include silicon or a refractory metal element. If the conductive material is formed after forming such electronic component within the substrate 82, the conductive material may not need to withstand a temperature greater than 800° C. In a particular embodiment, the conductive material is formed just before or as part of the interlevel dielectric (ILD)/interconnect sequence, and the conductive material may be exposed to temperatures as high as 500° C. An exemplary material can include silicon or a refractory metal element, copper, silver, a noble metal element, or any combination thereof.

The fill material may include an adhesion film, a barrier film, and a conductive-fill film. In a particular embodiment, the adhesion film includes a refractory metal, the barrier layer includes a refractory metal nitride, and the conductive-fill film includes a refractory metal different from the adhesion film. In another particular embodiment, the fill material includes doped polysilicon. The fill material can be formed by depositing the fill material using a chemical vapor deposition, physical vapor deposition, plating, coating, another suitable technique, or any combination thereof. In a particular embodiment, the fill material is deposited conformally.

A removal operation is performed to remove a portion of the fill material that overlies the stopping layer 86. The removal operation can be performed using an etching or polishing technique. FIG. 10 is an illustration at this point in the process sequence.

For the portions of the conductor 102 illustrated, where such portions correspond to the narrower portions of the trench, the fill material meets in the middle of the trench to form a seam 106 or a very small void 107. For the portions of the conductor 104 illustrated, where such portions correspond to the wider portions of the trench, voids 108 are formed. Although not illustrated in FIG. 10, the conductor 102 is formed in wider portions of its corresponding trench and has voids similar to voids 108, and the conductor 104 is formed in narrower portions of its corresponding trench and has seams or very small voids similar to seams 106 and very small voids. The voids 108 allow reaction and product gases during deposition to flow more easily into and out of the trenches. The likelihood of forming a void, such as 346 in FIG. 3, having a long length in a lateral direction is significantly lower and may be eliminated. Thus, delamination and other adverse effects are substantially less likely and may be eliminated.

Some etch tools may have difficulty in maintaining the shape of the depth of the trench as the aspect ratio of the trench increases. Thus, in an alternative embodiment (not illustrated), near the bottom of the trench, a buried void may form. The buried void may be similar to a tunnel that is connected to a plurality of the voids 108. The buried void may extend to an elevation that is no more than half way up the trench, a third of the way up the trench, a quarter of the way up the trench, or even less. The voids 108 and fill material in the upper part of the trench can help to maintain mechanical integrity and may not have the problems as described with respect to FIG. 3.

Figure 11:
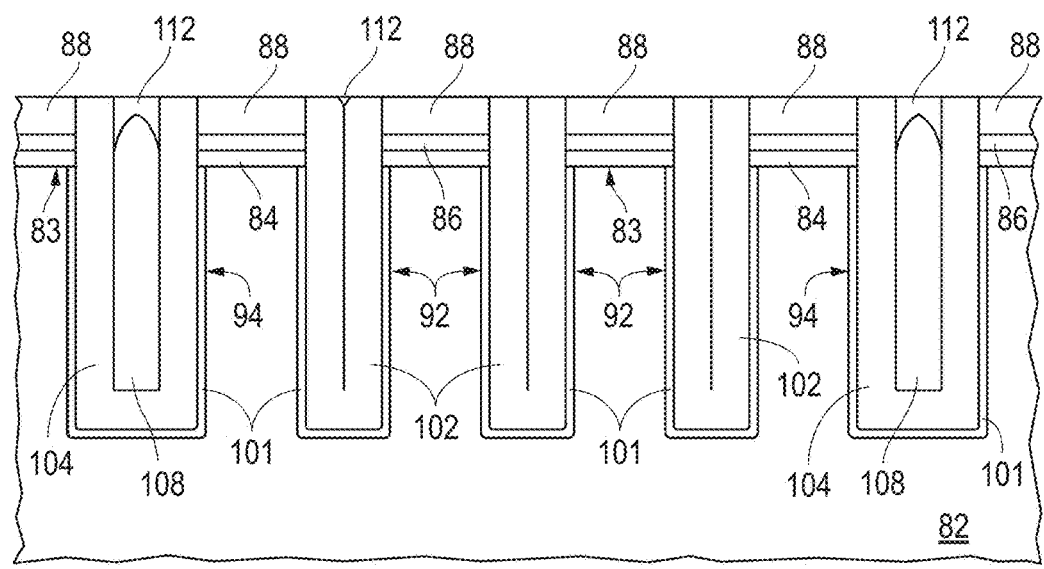
FIG. 11 includes an illustration of a cross-sectional view of the workpiece of FIG. 10 after capping voids within the trenches.

The very small voids 107 and voids 108 are capped off with capping portions 112 as illustrated in FIG. 11. A dep-etch-dep process sequence can be performed to form material along the top of the voids. The material used during the dep-etch-dep sequence can be the same material used to fill the trenches. The material deposited within the voids 108 during the dep-etch-dep process can have a profile in cross-section that appears to be arched, similar to an arched cathedral ceiling. In another embodiment, the dep-etch-dep process sequence is not performed, and the seams and voids 106 to 108 can be capped during sequent processing.

The process is continued to form a finished electronic device. The subsequent processing can be found in U.S. Pat. No. 8,492,260 and U.S. Pat. No. 8,981,533. The structures formed within the trenches can be used to form through-substrate vias, capacitors, or other electronic components.

Embodiments as described herein can be used to improve control when patterning the substrate to define the trenches, to improve the mechanical integrity of structures formed within the trenches, reduce leakage current or other parameters that adversely affect the electronic device. The wider portions of the trench can allow for etchants and etch process gases to flow more easily with in the trenches. More uniform depths between different trenches can be achieved. The wider portions also allow for better control over the location and size of where voids will be formed. Thus, the design of the electronic device can allow for better definition of trenches, more uniformity in depths of trenches, improved mechanical integrity of the structures formed within the trenches, and a reduced likelihood of delamination or other structural issues. The electronic device formed with such trenches may have less leakage current and more reproducible electronic characteristics from substrate to substrate.

Many different aspects and embodiments are possible. Some of those aspects and embodiments are described below. After reading this specification, skilled artisans will appreciate that those aspects and embodiments are only illustrative and do not limit the scope of the present invention. Exemplary embodiments may be in accordance with any one or more of the ones as listed below.

Embodiment 1. An electronic device comprising a substrate defining a first trench having a first portion and a second portion laterally adjacent to the first portion, wherein the first portion has a first width, the second portion has a second width, and the first width is wider than the second width; and a first material that defines a first void at a predetermined location that is within the first portion of the first trench and has a seam within the second portion of the first trench.

Embodiment 2. The electronic device of embodiment 1, further comprising an insulating layer between a sidewall of the first trench and the first material, wherein the first material is a conductive material.

Embodiment 3. The electronic device of embodiment 1, further comprising a second material, wherein the substrate defines a second trench, and the second material is disposed within the second trench, wherein each of the first and second materials is a conductive material.

Embodiment 4. The electronic device of embodiment 3, wherein the first material laterally surrounds the second material and is an isolation ring or part of an n-axial connector, wherein n is at least 2.

Embodiment 5. The electronic device of embodiment 3, wherein the depths of the first and second trenches are within no greater than 20% of each other.

Embodiment 6. The electronic device of embodiment 1, wherein the first material is at least part of a through-substrate via.

Embodiment 7. The electronic device of embodiment 1, wherein the second portion of the trench has an aspect ratio of at least 10.

Embodiment 8. The electronic device of embodiment 1, wherein from a top view, the first void has one or more lateral dimensions, wherein each of the one or more lateral dimensions of the first void is smaller than the first width; the first material that defines a second void; and from a top view, the second void has one or more lateral dimensions, wherein each of the one or more lateral dimensions of the second void is no greater than 0.3 times each of the one or more lateral dimensions of the first void.

Embodiment 9. The electronic device of embodiment 8, wherein the second void is not at a predetermined location.

Embodiment 10. An electronic device comprising a substrate defining a trench; and a material that defines spaced-apart voids at predetermined locations within the trench.

Embodiment 11. A process of forming an electronic device comprising:
   forming a masking layer over a substrate, wherein the masking layer defines a first opening including a first portion having a first width and a second portion having a second width, wherein the first width is wider than the second width;
   patterning the substrate to define a first trench having a first portion and a second portion corresponding to the first portion and the second portion of the first opening of the masking layer, wherein, as compared to using a different mask having a uniform width corresponding to the second width, during patterning, the first portion of the first trench allows an etchant gas to reach a location at or near a bottom of the first trench more readily, and etch product gas to be removed from the location at or near a bottom of the first trench more readily, or both; and
   depositing a material within the first trench.

Embodiment 12. The process of embodiment 11, wherein depositing the material within the first trench is performed such that, as compared to using a different mask having a uniform width corresponding to the second width, the first portion of the first trench allows a deposition material to reach a location at or near a bottom of the first trench more readily.

Embodiment 13. The process of embodiment 11, wherein depositing the material within the first trench is performed such that, as compared to using a different mask having a uniform width corresponding to the second width, the first portion of the trench allows a deposition reactant to reach the location at or near a bottom of the first trench more readily, a deposition product gas to be removed from the location at or near a bottom of the first trench more readily, or both.

Embodiment 14. The process of embodiment 11, wherein depositing the material defines a first void within the first trench, and the material has a seam within the second portion.

Embodiment 15. The process of embodiment 14, wherein at a highest elevation of the first void, the first void does not have a lateral dimension that is greater than the first width of the first trench.

Embodiment 16. The process of embodiment 14, wherein patterning the substrate is performed such that the first trench includes additional spaced-apart first portions at predetermined locations with additional second portions between the additional spaced-apart first portions; and depositing the material defines additional spaced-apart first voids within the first trench, and the material defines a second void within the additional spaced-apart second portions, wherein the second void is not at a predetermined location.

Embodiment 17. The process of embodiment 11, wherein a first void defined by the material is located within the first portion of the first trench, and from a top view, the first void has one or more lateral dimensions, wherein each of the one or more lateral dimensions of the first void is smaller than the first width; and a second void defined by the material is located within the second portion of the first trench, and from a top view, the second void has one or more lateral dimensions, wherein each of the one or more lateral dimensions of the second void is no greater than 0.3 times each of the one or more lateral dimensions of the first void.

Embodiment 18. The process of embodiment 11, further comprising capping the first void with a capping material.

Embodiment 19. The process of embodiment 18, wherein capping is performed using a dep-etch-dep technique.

Embodiment 20. The process of embodiment 11, wherein:
the masking layer defines a second opening, wherein the first opening laterally surrounds the second opening;
patterning the substrate further defines a second trench that surrounds the first trench;
the process further comprising forming an insulating layer along sidewalls of the first and second trenches before depositing the conductive material; and
depositing the material is performed such that the material is deposited in the second trench, wherein the material is conductive.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
forming a masking layer over a substrate, wherein the masking layer defines a first opening including a first portion having a first width and a second portion having a second width, wherein the first width is wider than the second width;
patterning the substrate to define a first trench having a first portion and a second portion corresponding to the first portion and the second portion of the first opening of the masking layer, wherein, as compared to using a different mask having a uniform width corresponding to the second width, during patterning, the first portion of the first trench allows an etchant gas to reach a location at or near a bottom of the first trench more readily, and etch product gas to be removed from the location at or near a bottom of the first trench more readily, or both; and
depositing a material within the first trench.

2. The process of claim 1, wherein depositing the material within the first trench is performed such that, as compared to using a different mask having a uniform width corresponding to the second width, the first portion of the first trench allows a deposition material to reach a location at or near a bottom of the first trench more readily.

3. The process of claim 1, wherein depositing the material within the first trench is performed such that, as compared to using a different mask having a uniform width corresponding to the second width, the first portion of the trench allows a deposition reactant to reach the location at or near a bottom of the first trench more readily, a deposition product gas to be removed from the location at or near a bottom of the first trench more readily, or both.

4. The process of claim 1, wherein depositing the material defines a first void within the first trench, and the material has a seam within the second portion.

5. The process of claim 4, wherein at a highest elevation of the first void, the first void does not have a lateral dimension that is greater than the first width of the first trench.

6. The process of claim 4, wherein:
patterning the substrate is performed such that the first trench includes additional spaced-apart first portions at predetermined locations with additional second portions between the additional spaced-apart first portions; and
depositing the material defines additional spaced-apart first voids within the first trench, and the material defines a second void within the additional spaced-apart second portions, wherein the second void is not at a predetermined location.

7. The process of claim 1, wherein:
a first void defined by the material is located within the first portion of the first trench, and from a top view, the first void has one or more lateral dimensions, wherein each of the one or more lateral dimensions of the first void is smaller than the first width; and
a second void defined by the material is located within the second portion of the first trench, and from a top view, the second void has one or more lateral dimensions, wherein each of the one or more lateral dimensions of the second void is no greater than 0.3 times each of the one or more lateral dimensions of the first void.

8. The process of claim 1, further comprising capping the first void with a capping material.

9. The process of claim 8, wherein capping is performed using a dep-etch-dep technique.

10. The process of claim 1, wherein:
the masking layer defines a second opening, wherein the first opening laterally surrounds the second opening;
patterning the substrate further defines a second trench that surrounds the first trench;
the process further comprising forming an insulating layer along sidewalls of the first and second trenches before depositing the conductive material; and
depositing the material is performed such that the material is deposited in the second trench, wherein the material is conductive.

11. A process of forming an electronic device comprising:
forming a masking layer over a substrate, wherein the masking layer defines a first opening including a first portion having a first width and a second portion having a second width, wherein the first width is wider than the second width;
patterning the substrate to define a first trench having a first portion and a second portion corresponding to the first portion and the second portion of the first opening of the masking layer; and
depositing a material within the first trench, wherein, as compared to using a different mask having a uniform width corresponding to the second width, the deposited material has a reduced likelihood of delaminating from a wall of the trench.

12. The process of claim 11, wherein the first portion of the first trench is in a range of 10% to 500% wider than the second portion of the first trench.

13. The process of claim 12, wherein the first portion of the first trench has a width in a range of 0.5 micron to 5.0 microns.

14. The process of claim 11, wherein:
forming the masking layer is performed such that the masking layer defines a second opening;
patterning the substrate is performed to form a second trench; and
depths of the first and second trenches are within no greater than 20% of each other.

15. The process of claim 14, wherein at least a portion of the second trench has a width less than the first portion of the first trench.

16. The process of claim 14, wherein each of the first and second trenches have an aspect ratio of at least 11.

17. The process of claim 14, wherein each of the first and second trenches has a depth of at least 11 microns.

18. The process of claim 11, wherein:
depositing a material within the first trench is performed such that a first void is formed at a predetermined location within the first portion of the trench; and
the process further comprises capping the first void with a capping material.

19. The process of claim 18, wherein capping is performed such that a second void is formed within the second portion of the trench, wherein the second void has a lateral dimension no greater than 0.3 times the a lateral dimension of the first void.

20. A process of forming an electronic device comprising:
forming a masking layer over a substrate, wherein the masking layer defines a opening including a first portion having a first width and a second portion having a second width, wherein the first width is wider than the second width;
patterning the substrate to define a trench having a first portion and a second portion corresponding to the first portion and the second portion of the opening of the masking layer, wherein, as compared to using a different mask having a uniform width corresponding to the second width, during patterning, the first portion of the trench allows an etchant gas to reach a location at or near a bottom of the trench more readily, and etch product gas to be removed from the location at or near a bottom of the trench more readily, or both; and
depositing a material within the trench, wherein the deposited material defines a void in a predetermined location within the first portion of the trench.

* * * * *